United States Patent
Lai (10) Patent No.: US 6,492,009 B1
(45) Date of Patent: Dec. 10, 2002

(54) MANUFACTURE AND METHOD FOR OBTAINING ACCURATELY DIMENSIONED FEATURES FROM A METAL-CONTAINING WEB PROCESSED WITH A CONTINUOUS ETCH PROCESS

(75) Inventor: Laurence M C Lai, Mississauga (CA)

(73) Assignee: Graphic Packaging Corporation, Golden, CO (US)

(*) Notice: Subject to any disclaimer, the term of this patent is extended or adjusted under 35 U.S.C. 154(b) by 0 days.

(21) Appl. No.: 09/957,874

(22) Filed: Sep. 20, 2001

(51) Int. Cl.⁷ ................. B32B 7/00; C23F 1/00
(52) U.S. Cl. ............ 428/209; 428/689; 216/91; 430/313
(58) Field of Search ............ 156/630–1, 634–635, 156/639, 642–645, 656, 659.1, 660, 665, 345, 902; 428/195, 209, 458, 688, 689; 216/91; 430/313, 318, 319

(56) References Cited

U.S. PATENT DOCUMENTS

| | | |
|---|---|---|
| 3,536,545 A | 10/1970 | E.J. Traynor et al. |
| 3,898,095 A | 8/1975 | Berdan et al. |
| 3,913,219 A | 10/1975 | Lichtblau .................. 29/592 |
| 4,398,994 A | 8/1983 | Beckett |
| 4,552,614 A | 11/1985 | Beckett |
| 4,610,755 A | 9/1986 | Beckett |
| 4,869,778 A | 9/1989 | Cote |
| 4,915,780 A | 4/1990 | Beckett |
| 4,935,093 A | 6/1990 | Reeb |
| 5,117,078 A | 5/1992 | Beckett |
| 5,340,436 A | 8/1994 | Beckett |
| 5,628,921 A * | 5/1997 | Beckett ................ 216/102 |
| 6,355,387 B1 * | 3/2002 | Fujinaga et al. ........... 430/30 |

* cited by examiner

Primary Examiner—Deborah Jones
Assistant Examiner—A B Sperty
(74) Attorney, Agent, or Firm—Dorsey & Whitney LLP (57) ABSTRACT

Corruption of features formed by etching a metal-containing web in a continuous etch process is reduced by distorting the original design or designs of the features to compensate for localized areas subject to excessive etching during the continuous etch process. In the case of a planar speaker diaphragm, for example, the width of the portions of the trace that are in a cross-machine direction is increased to compensate for the higher etching rate caused by the motion through the etch bath. While this causes the modified trace design to appear to be distorted relative to the original trace design, the etched trace resulting from the modified trace design has improved uniformity and greater fidelity to the original trace design than if the original trace design had been used in the continuous etch process.

10 Claims, 4 Drawing Sheets

MANUFACTURE AND METHOD FOR OBTAINING ACCURATELY DIMENSIONED FEATURES FROM A METAL-CONTAINING WEB PROCESSED WITH A CONTINUOUS ETCH PROCESS

BACKGROUND OF THE INVENTION

1. Field of the Invention

The present invention relates to forming features in a metal-containing web using a continuous etch process, and more particularly to forming accurately dimensioned features in a metal-containing web by a continuous etch process.

2. Description of the Related Art

Functional patterns formed into aluminum foil are used in a variety of products, including thin foil products such as microwave plates, trays and bowls, as well as thick foil products such as planar speakers, electronic circuitry surveillance products used for shoplifting prevention in retail environments, and flexible heaters, just to name a few. Common processes to form these products includes chemical milling or chemical etching of a metal-containing layer of a web. The metal-containing layer typically is a metal foil of aluminum or copper or, less commonly, silver having a desired thickness that is laminated to or otherwise formed on a suitable substrate. A desired pattern is formed on the surface of the metal foil with a etch resistant protective coating, typically by using Gravuere printing. The web with the printed metal foil is introduced to an etching solution, whereupon the metal foil in the open areas of the pattern is etched away to leave behind the desired protected features of the pattern. The etching bath can be acidic or basic in nature, depending on the type of metal. The foil can be of different thickness, depending on the intended function of the desired product. Typical foil thickness is from about 1 micron to about 15 microns and greater for microwave applications, from about 5 microns to about 50 microns and greater for planar speakers and flexible heaters, and from about 5 microns to about 70 microns and greater for electronic article surveillance products.

Continuous etching or milling processes are particularly advantageous when large amounts of patterned web is required because of the low cost per product unit relative to non-continuous processes. A particularly useful continuous demetallizing process-and apparatus are described in U.S. Pat. No. 5,340,436, which issued Aug. 23, 1994 to D. Gregory Beckett. Generally speaking, the apparatus has an elongate tank that holds a bath of aqueous etchant material. The web containing the metal layer to be etched initially is arranged in a roll. The web is taken off of the roll and guided into the bath at one end, guided either horizontally or sinusoidally through the bath, and removed from the bath and taken up on another roll at the opposing end of the bath. The web is driven along its path by any suitable drive mechanism. An example of a drive mechanism is a combination of driven belts and roller elements. The web passes between these elements, which engage the web and drive it.

Figure 1:
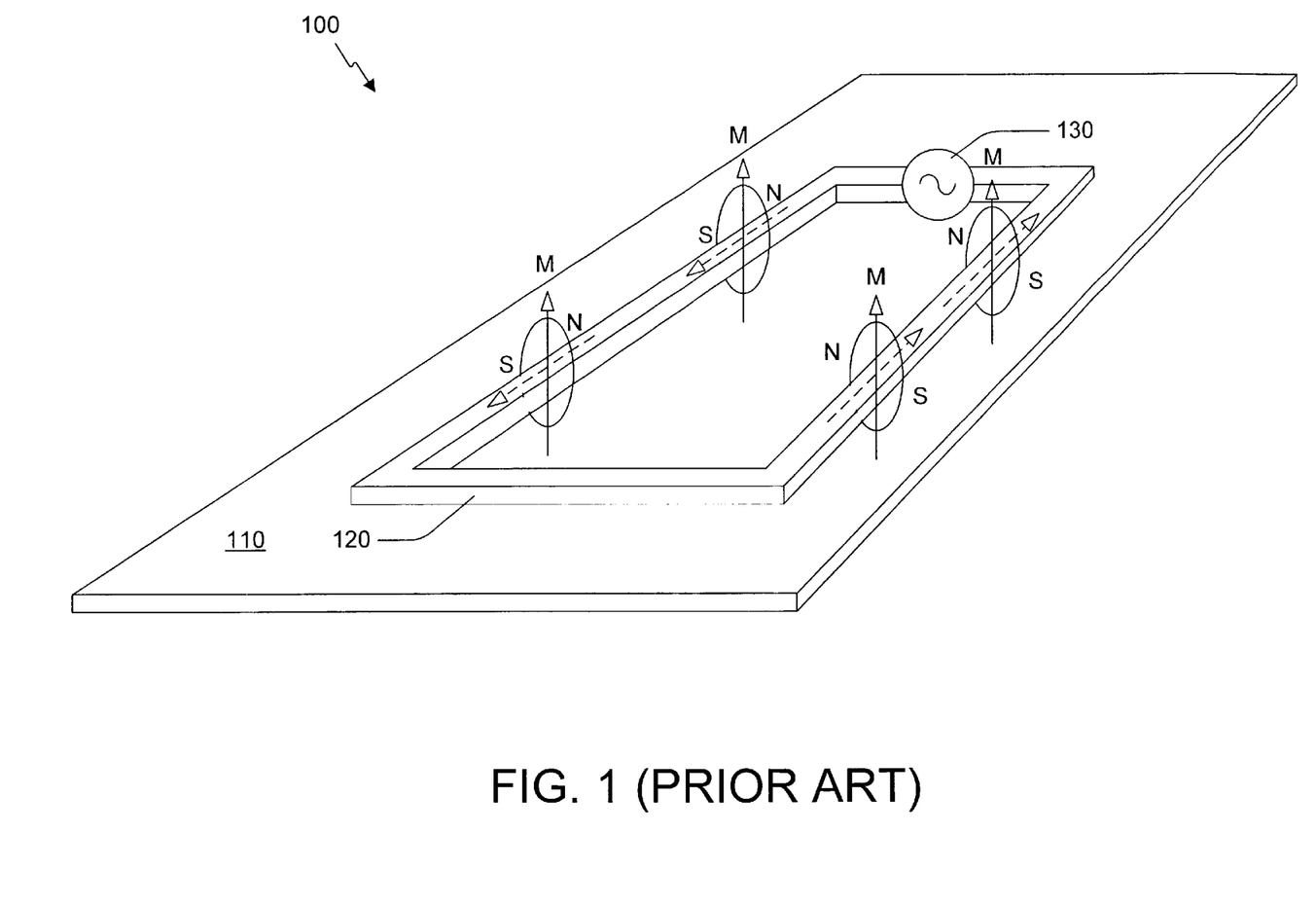
FIG. 1 is a schematic drawing showing the principles behind operation of a planar speaker of the prior art.

The continuous etch process of the '436 patent has commonly and successfully been used to make blanks for microwave plates, trays and bowls, but it also is useful in the large scale fabrication of items such as planar speakers, electronic circuitry surveillance products, and flexible heater elements, all of which are made from webs having thicker metal layers. Planar speakers have been known for many years but have not achieved widespread commercial success because of the relatively cost of manufacture of the diaphragm element. A schematic of an illustrative planar speaker diaphragm 100 is shown in FIG. 1, greatly simplified for purposes of clarity. FIG. 1 shows a thin conductive path 120 mounted on a thin insulating flexible substrate 110. A alternating audio current is established in the path 120 by an audio source 130. The dashed arrows indicate current flow at a moment in time. The current flow is shown in a counterclockwise direction, which establishes a magnetic field about the path 120 as indicated by the ovals with north indicated by "N" and south indicated by "S." A force is induced on the diaphragm 100 due to the interaction of the magnetic field with a series of permanent magnets mounted behind the diaphragm 100 (not shown), causing the diaphragm to move in a direction indicated by the arrows marked "M." The acceleration of the diaphragm 100 is a function of many variables, including the length, thickness and width of each trace in the conductive path as well as the number and spacing of the traces. The best conductive path includes a number of very thick but narrow traces of very specific design that are densely packed. The diaphragm 100 typically is the most expensive component of the planar speaker to make.

Accordingly, it is desired to make various products that include thick metal features, such as conductive traces used in speaker diaphragms, electronic circuitry surveillance products, and flexible heaters, at lower cost but without sacrificing the quality of the traces in the conductive path.

BRIEF SUMMARY OF THE INVENTION

While continuous etch processes such as the process of the '436 patent are useful in the fabrication of patterned product units on webs, they are not entirely satisfactory for etching product units that include thick conductive traces because the trace designs are distorted by the movement of the web through the bath. This and other disadvantages in using continuous etch processes in the fabrication of patterned webs that include thick conductive traces are overcome in the present invention, which in one embodiment is a metal-containing web for use in a continuous etch process to produce a product unit having at least one feature corresponding to an original feature design. The metal-containing web comprises a metal-containing layer and an etch-resistant layer disposed over the metal-containing layer. The etch-resistant layer has a pattern defining the feature, the pattern having portions transverse to a direction of elongation of the web being enlarged relative to corresponding portions of the original feature design.

Another embodiment of the present invention is a metal-containing web for use in a continuous etch process to produce a planar speaker product unit having at least one trace corresponding to an original trace design. The web comprises a substrate layer, a metal-containing layer disposed over the substrate layer, and an etch-resistant layer disposed over the metal-containing layer. The etch-resistant layer has a pattern defining the trace. The pattern has portions transverse to a direction of elongation of the web being widened relative to corresponding portions of the original feature design. The pattern also has portions parallel to a direction of elongation of the web being unmodified relative to corresponding portions of the original feature design.

A further embodiment of the present invention is a pattern-containing printing cylinder for printing a resist pattern on a web in a continuous etch process to produce a product unit having at least one feature corresponding to an original feature design. The pattern on the cylinder has portions transverse to a direction of rotation of the cylinder that are enlarged relative to corresponding portions of the original feature design.

Yet another embodiment of the present invention is a method of preparing a modified trace design having at least one trace for use in effecting selective demetallization of a metal-containing web in a continuous etch process. The method comprises conceiving an original trace design; envisioning placement of the original trace design on the web, wherein at least some segments of the original trace design are transverse to a direction of elongation of the web; and widening at least some of the segments of the original trace design that are transverse to a direction of elongation of the web to obtain the modified trace design.

A further embodiment of the present invention is a method of preparing a practical feature design for use in effecting selective demetallization of a metal-containing web in a continuous etch process. The method comprises conceiving an ideal feature design; envisioning placement of the ideal feature design on the web, wherein at least some portions of the ideal feature design are transverse to a direction of elongation of the web; and widening at least some of the portions of the ideal feature design that are transverse to a direction of elongation of the web to obtain the practical feature design.

Yet another embodiment of the present invention is a method of effecting selective demetallization of a web in accordance with a feature design, the web being formed by a layer of aluminum supported on flexible substrate layer. The method comprises applying a sodium hydroxide-resistant material to the aluminum layer, the sodium hydroxide-resistant layer comprising a pattern for defining the feature and the pattern having portions transverse to a direction of elongation of the web, a substantial number of the transverse portions of the pattern being enlarged relative to corresponding portions of the feature design; continuously passing the aluminum layer in an immersed condition through a bath of aqueous sodium hydroxide based solution to effect removal of aluminum from areas of the web not protected by the pattern; and washing the aluminum layer free from spent sodium hydroxide based solution.

DETAILED DESCRIPTION OF THE INVENTION, INCLUDING THE PREFERRED EMBODIMENT

Many useful products such as microwave plates, trays and bowls, planar speakers, electronic circuitry surveillance products, and flexible heaters are made from product units that contain one or more etched features. The features serve various well known functions in the final product, including shielding, localized heating, standing wave modification, and attenuation in microwave applications, magnetic field generation in planar speakers, heat generation in flexible heaters, and field disruption in electronic circuitry surveillance. The shape of a feature is influenced by function, and ranges from patch-like to trace-like.

Continuous etch processes such as the process of the '436 patent are useful in the fabrication of patterned product units on webs. These processes involve the lengthwise movement of a web through an etch bath in a direction known as the "machine direction." The other direction along the width of the web is known as the "cross-machine direction." Unfortunately, continuous etch processes are not entirely satisfactory for etching product units that include thick metal-containing features because the feature dimensions are corrupted. The corruption is particularly evident in product units having thick features because the web may be moved through the etch bath for a longer time, or exposed to a higher etch rate, or both in order to etch away unneeded areas of thick metal from the web and obtain the desired features.

Feature corruption may be caused in various ways depending on the process details. One possible cause of corruption encountered in the Gravuere printing process arises from the use of a doctor blade on the pattern-containing cylinder, which erodes the leading edges of the pattern on the cylinder having cross-machine orientations. Another possible cause of corruption encountered in the Gravuere printing process is the thinning of the printed pattern at its edges, which makes the parts of the printed pattern having a cross-machine orientation especially vulnerable to being eroded as the web is moved through the etch bath. Another possible cause of corruption is accelerated etching of the sidewalls of the metal-containing features having cross-machine orientations due to turbulence of the etch fluid. Regardless of the cause of the feature corruption, the result is non-uniform etching of the web.

Figure 2:
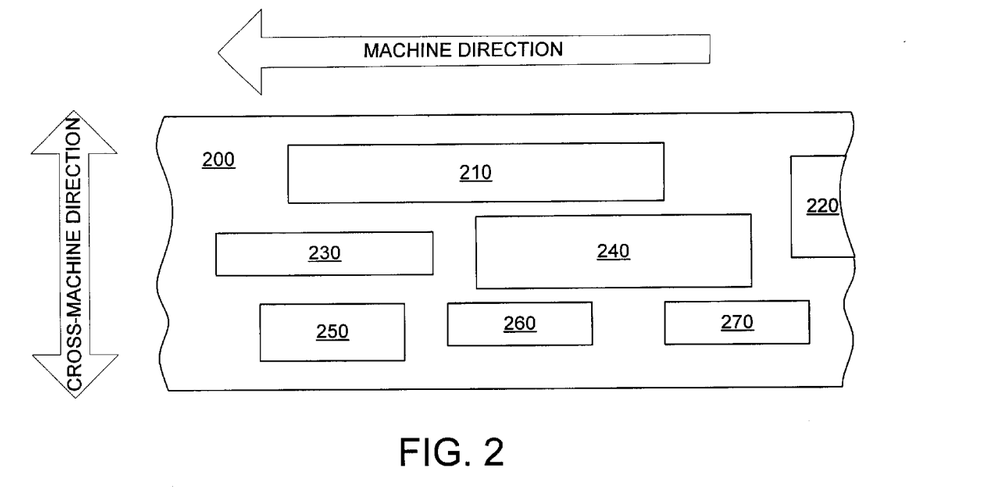
FIG. 2 is a schematic representation of the movement of a web containing product units through a machine that performs a continuous etch.

The product units and the feature or features within them can have a variety of different shapes. An example of a product unit shape common to applications such as diaphragms for planar speakers, heater panels, and electronic surveillance circuitry is rectangular. FIG. 2 is a schematic diagram of a section of a web 200 that contains a number of such rectangular product units 210, 220, 230, 240, 250, 260 and 270 of various sizes and configurations. The web 200 is moved through the bath of a continuous etch process along its length, as indicated by the arrow marked "MACHINE DIRECTION." The other direction is the "CROSS-MACHINE DIRECTION."

Figure 3:
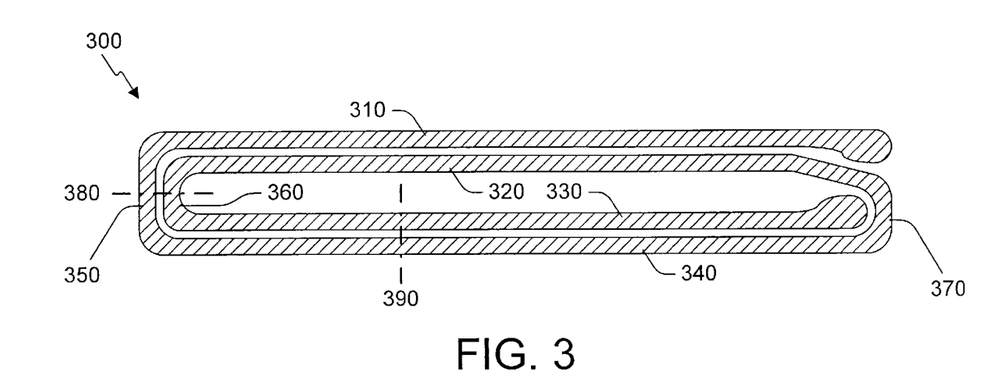
FIG. 3 is a plan view of an illustrative trace design.

The rectangular product units 210, 220, 230, 240, 250, 260 and 270 contain multiply-folded traces that are very long, very narrow, and relatively thick. FIG. 3 is an example of an original trace design for a planar speaker circuit, greatly simplified for purposes of clarity and explanation, which has a single long trace 300 folded three times which is set within a frame (not shown) in a manner well known in the art. Long sections 310, 320, 330 and 340 of the trace 300 are oriented in a longitudinal direction relative to the web, or in the machine direction relative to the motion of the web through the continuous demetallizing apparatus (FIG. 2). These long sections are interconnected by relatively short sections 350, 360 and 370 that are oriented in a latitudinal direction relative to the web, or in a cross-machine direction relative to the motion of the web through the continuous demetallizing apparatus (FIG. 2).

Figure 4A:
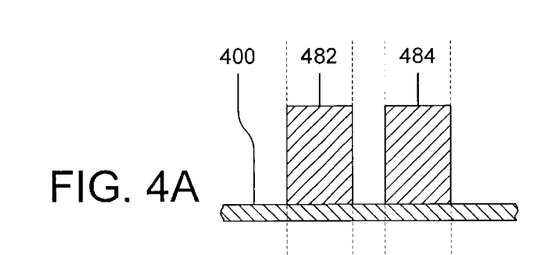
FIGS. 4A and 4B are cross-section views of ideal etched trace profiles from the trace design of FIG. 3.
Figure 4B:
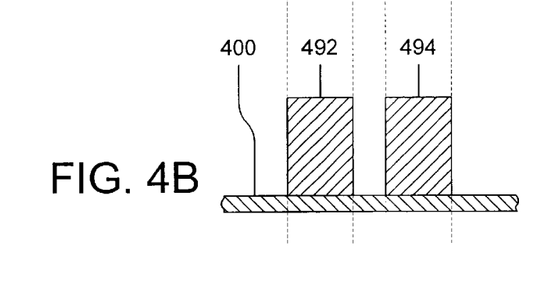
Figure 5A:
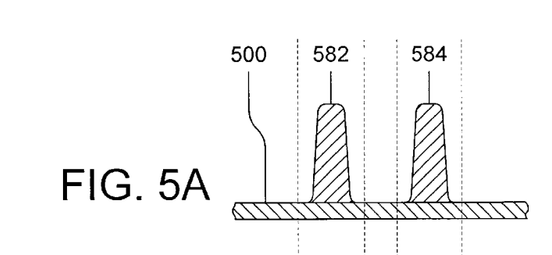
FIGS. 5A and 5B are cross-section views showing the generalized appearance of etched traces from the trace design of FIG. 3 as obtained in practice.
Figure 5B:
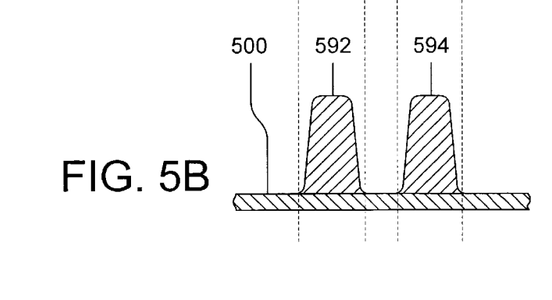

If the original trace design 300 of FIG. 3 is used to produce an etched trace in the continuous etch process, the resulting etched trace may not be acceptable because of over-etching of the short sections 350, 360 and 370. Ideally, the parts of the original trace design 300 indicated generally at 380 and 390 would result in etched trace cross-sections 482 and 484, and 492 and 494 respectively, which are shown in FIG. 4A and FIG. 4B upon a substrate 400. However, when the original trace design 300 is used in practice to produce an etched trace in a continuous etch process, the parts of the original trace design 300 indicated generally at 380 and 390 result in etched trace cross-sections 582 and 584, and 592 and 594 respectively, which are shown in FIG. 5A and FIG. 5B upon the substrate 500. Although tapered somewhat by the etching process, the parts 592 and 594 of the etched trace shown in FIG. 5B are well formed, having the desired width and thickness. However, the parts 582 and 584 of the etched trace shown in FIG. 5A are not suitable, being significantly narrower than desired and with somewhat less contact area upon the substrate 500. The tendency of the trace sections lying in a cross-machine to be over-etched lowers the design tolerance of the trace. Moreover, over-etched trace sections may affect the circuit impedance so that the diaphragm may be unusable, or may fail during use due to overheat and cracking or separation from the substrate.

It will be appreciated that the trace cross-sections shown in FIG. 5A and 5B are simplified for purposes of clarity and explanation. Many factors, including the quality of the etch-resistant masking material, the proximity of adjacent trace sections, and the precise orientation of the trace sections relative to the motion through the etch bath, have an effect on the precise cross-sectional profile. In the case of the trace sections lying in the cross-machine direction, the leading edge may acquire a different profile that the trailing edge due to differing shears and differing distributions of micro pools and eddies in the etching fluid about the leading and trailing edges of the trace section. These factors affect different parts of the trace sections in the cross-machine direction differently, so that the actual profiles vary somewhat from leading edge to trailing edge and from place to place along these trace sections.

While corruption of feature dimensions can be tolerated for some types of product units, other types of product units require a high degree of fidelity between the original feature design and the etched features appearing in the product unit. This is particular true of the circuit in a speaker diaphragm, for example, which typically has one very lengthy multiply-folded trace—but which may have more than one trace if desired—that is designed to have a specific impedance and to induce a specifically shaped magnetic field upon the application of a drive current. A significant deviation from the original trace design in any part of the etched trace can cause the speaker diaphragm to be out of specification, thereby decreasing the process yield and increasing manufacturing cost. Moreover, a significant deviation from the original trace design in any part of the etched trace can cause the speaker diaphragm to fail after installation in the product, thereby leading to poor product reliability and higher after-sale warranty expenses.

The corruption is compensated for by distorting the original design of the feature to compensate for localized areas subject to excess etching during the continuous etch process. In the case of a planar speaker diaphragm, for example, the width of the portions of the trace that are in a cross-machine direction is increased to compensate for the corruption of these portions of the trace in the continuous etch process. While this causes the modified trace design to appear to be distorted relative to the original trace design, the etched trace resulting from the modified trace design has improved uniformity and greater fidelity to the original trace design than if the original trace design had been used.

Figures 6, 7A, 7B, 8A, 8B:
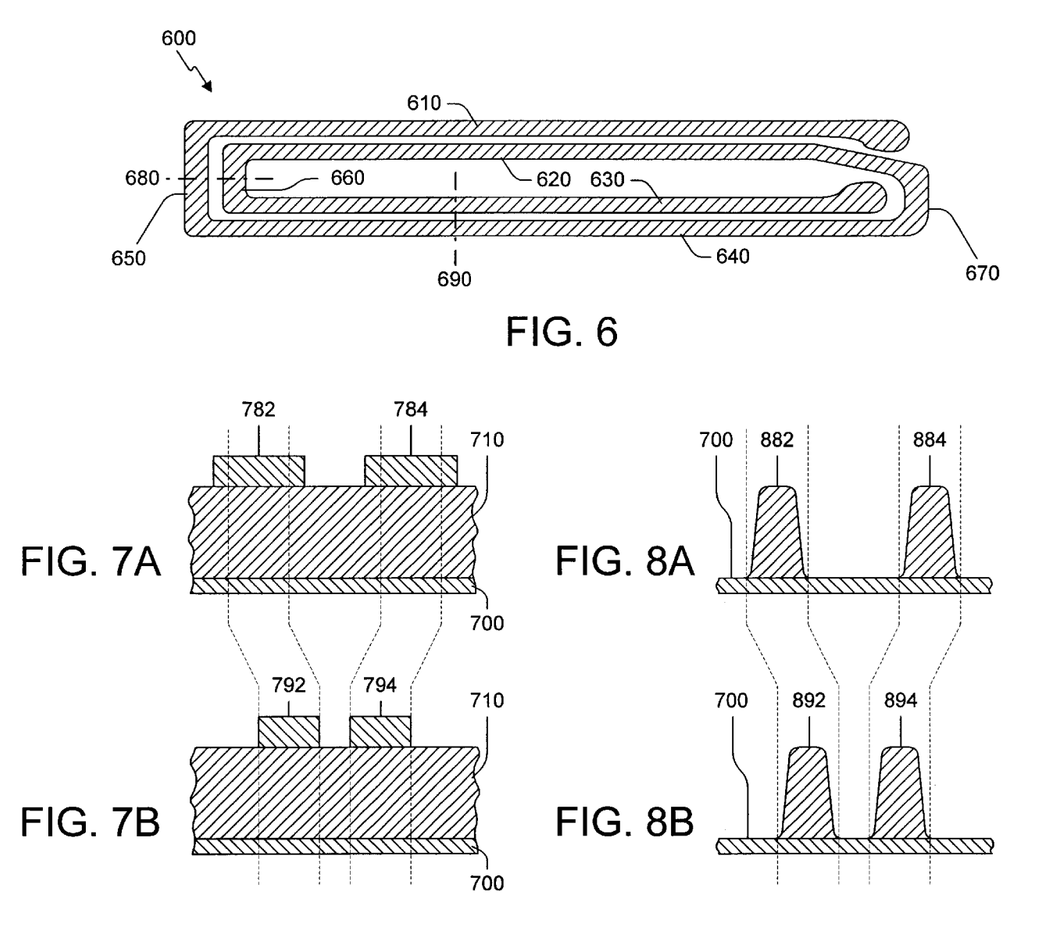
FIG. 6 is a plan view of an illustrative improved trace design.
FIGS. 7A and 7B are cross-section views showing a resist pattern from the improved trace design of FIG. 6 on a web.
FIGS. 8A and 8B are cross-section views showing the generalized appearance of etched trace profiles from the trace design of FIG. 6 as obtained in practice.

FIG. 6 shows a modified trace design 600, greatly simplified for purposes of clarity and explanation, which has a single long trace folded three times. Long sections 610, 620, 630 and 640 of the trace design 600 are oriented in a longitudinal direction relative to the elongation of the web, or in the machine direction relative to the motion of the web through the continuous demetallizing apparatus (FIG. 2). These long sections are interconnected by relatively short sections 650, 660 and 670 that are oriented in a latitudinal direction relative to the elongation of the web, or in a cross-machine direction relative to the motion of the web through the continuous demetallizing apparatus (FIG. 2). Adjacent short latitudinal sections such as 650 and 660 are spaced apart a little more than adjacent longitudinal sections such as 610 and 620 and 630 and 640 for reasons of design convenience, because the spacing of the etched trace sections corresponding to these short latitudinal sections is not important to the function of the speaker circuit. If desired, the spacing may be maintained the same, or the spacing between the adjacent short latitudinal sections 650 and 660 may be narrower than the spacing of the adjacent longitudinal sections 610 and 620 and 630 and 640 so that the resulting spaces between the etched trace sections corresponding to the sections 610, 620, 630, 640, 650 and 660 are all equal.

When the modified trace design 600 is used in practice to produce an etched trace in a continuous etch process, the parts of the modified trace design 600 indicated generally at 680 and 690 result in etched trace cross-sections 882 and 884, and 892 and 894 respectively, which are shown in FIG. 8A and FIG. 8B upon a substrate 700. Although tapered somewhat by the etching process, the parts 882, 884, 892 and 894 of the etched trace shown in FIGS. 8A and 8B are all well formed, having the desired width and thickness. The improvement in particular of the parts 882 and 884 (FIG. 8A), which are produced from the modified trace design 600 and correspond to cross-machine sections 650 and 660 (the cross-machine section 670 is similarly improved), is apparent relative to the parts 582 and 584 (FIG. 5A) produced from the modified trace design 300.

While the modified trace design 600 is designed to result in essentially equally wide etched trace parts, it will be appreciated that feature designs generally may be modified to result in any desired final size of etched features or feature sections subject to over-etching, which may be equal or unequal to the final size of other etched features or feature sections not subject to over-etching.

Examples of a particularly effective and economical continuous demetallizing process and of machinery useful for practicing the process are described in U.S. Pat. No. 5,340, 436, which is entitled "Demetallizing Procedure" and issued Aug. 23, 1994 to D. Gregory Beckett, which is hereby incorporated herein in its entirety by reference. The '436 patent involves the selective demetallizing of an etchable metal layer supported on a layer of suitable material or a self-supporting etchable metal layer. In one embodiment, a web of polymeric material bearing the etchable metal layer, illustratively aluminum, has a pattern of etch-resistant material applied to it. Then, the web is immersed in and passed through a bath of aqueous etchant, illustratively an aqueous sodium hydroxide base solution at an elevated temperature, for a time at least sufficient to remove the etchable metal from non-protected areas of the web. The demetallized web is washed and dried.

An illustrative metal-containing web that has etch-resistant resist patterns for forming various functional and perhaps other features when processed in the continuous etch processes of the '436 patent and others like it is now described in detail. The initial web laminate is formed by mounting a metal foil or a metal-containing foil onto a suitable substrate, such as polyester or polymeric material. While any suitable method may be used, a suitable well known process for aluminum, for example, involves laminating aluminum foil to a layer of polyester or polymeric material using a dry bond adhesive, in a manner well known in the art. The foil thickness for use in continuous etch processes and equipment like that described in the '436 patent is generally determined by the capabilities of the foil manufacturer and the limitations of the web handling components in handling rolls of web layer materials and the finished web. Presently, these factors establish a foil thickness in the range of from about 1 micron to about 75 microns, although thicker foils may be use in the future. The actual thickness of foil used in the web depends on the application. Illustratively, for microwave applications, aluminum foil of about 1 micron to about 15 microns thickness and greater is mounted to a PET polyester film of about 48 gauge. Illustratively, for planar speaker diaphragms, aluminum foil of about 5 microns to about 50 microns thickness and greater is mounted to a PEN film of about 48 gauge. However, greater foil thickness such as 70 microns or even 100 microns may be used for large planar speakers. Illustratively, for electronic article surveillance products, aluminum foil of from about 5 microns to about 70 microns thickness and greater is mounted to a PET polyester film of about 48 gauge.

Next, a pattern of etch-resistant material such as, for example, resin is printed by, for example, using Gravuere printing onto the foil side of the web to form a protective etch mask, in a manner well known in the art. A suitable etch-resistant material for a sodium hydroxide base solution etchant is a vinyl chloride co-polymer resin. Other techniques for forming a pattern of etch-resistant material include spraying and the use of photoresist material. The thickness of the etch-resistant layer is determined by the strength and temperature of the etchant along with the time over which the etch-resistant material is exposed to the etchant, in a manner well known in the art. The protective coating is dried and the web either is rolled onto a spindle for later etching in a continuous demetallizing process, or is directly introduced into the continuous demetallizing process. While the particular size of the web depends on the particular equipment used in the process, a typical web size for the process and equipment described in the '436 patent is from about 31 to about 36 inches wide and about 5000 feet to about 10,000 feet long, rolled onto a spindle in a manner well known in the art.

An example of a web contain a patterned resist for a planar speaker diaphragm is shown in FIGS. 7A and 7B. Illustratively, the web has an aluminum foil layer 710 of about 5 microns to about 50 microns thickness that is bonded to a PEN film substrate 700 of about 48 gauge. The resist layer is patterned to produce a trace design over the aluminum foil layer 710, sections of which are indicated in FIG. 7A by resist features 782 and 784, in FIG. 7B by resist features 792 and 794. The width of resist features 782 and 784 illustratively is from about five percent to about fifty percent greater than the width of resist features 792 and 794 where the same etched trace width is desired. It will be appreciated that the specific materials and the thickness and other dimensions are illustrative, and will vary considerably in practice depending on a many factors such as the particular feature design, the thickness of the metal-containing layer, the orientation of the feature parts relative to the machine direction, the desired results, and the specific application. The degree of enlargement of the width in the machine direction of the cross-machine sections of features may be determined either entirely empirically, or by etch rate calculation in a manner well known in the art and fine-tuned empirically, as desired.

Next, the web is etched in the continuous demetallizing process, in a manner well known in the art. For example, after etching of the aluminum film 710 and removal of the unequally wide resist features 782, 784 and 792, 794 (FIGS. 7A and 7B), the essentially equally wide etched trace parts 882, 884, 892 and 894 result (FIGS. 8A and 8B).

Subsequent steps depend on the product being made. Where the product is for microwave cooking applications, illustratively the web is laminated using a wet bond adhesive to a paper product having any suitable thickness, typically from about 20 pound paper to about 24 point paperboard, and various product units which include one or more of the functional features are cut out using any suitable technique such as a die cutting machine or robotic cutting, as are well known in the art. Microwave cooking articles are available from a variety of manufacturers, including Graphic Packaging Corporation of Golden, Colo. Where the product is for planar speaker applications, the functional features include circuit elements, and various product units which includes respective circuits formed from one or more of the circuit elements are cut out using any suitable technique such as a die cutting machine or robotic cutting, as are well known in the art, and suitably packaged into a speaker housing. Planar speaker drivers are available from a variety of manufacturers, including American Technology Corporation of San Diego, Calif. Where the product is for electronic article surveillance products, the functional features include circuit elements, and various product units which includes respective circuits formed from one or more of the circuit elements are cut out using any suitable technique such as a die cutting machine or robotic cutting, as are well known in the art, and suitably packaged. The finished products tend to be about one to about one and a half inch square, but other sizes and shapes are also used. Electronic article surveillance products are available from a variety of manufacturers, including Unisen Corporation of Boca Raton, Fla.

It will be appreciated that the type of metal or metal-containing material and the substrates described herein are illustrative, as are the various thickness, widths, lengths, and so forth. The planar speaker diaphragm described herein also is illustrative, as the techniques described herein are applicable to other applications, and are particularly advantageous when applied to other applications that involve the use of thick metal foil such as, for example, electronic circuit surveillance products and flexible heaters. The choice as to material and thickness depends on the application and the temperature of the demetallizing process. For example, polyethylene terepthalate ("PET") is suitable for many applications over a wide range of process temperatures, while Kaladex™ polyethylene naphthalate ("PEN") and Kapton™ polyimide, which are available from E.I. du Dupont de Nemours and Company of Wilmington, Del., are especially suitable where metal-containing webs are processed at elevated bath temperatures.

While the latitudinal sections 650, 660 and 670 shown in the modified trace design 600 of FIG. 6 preferably are all wider than the corresponding sections 350, 360 and 370 of the original trace design 300, this may not be a necessary condition. Provided that the over-etched sections do not fail mechanically in some fashion, some latitudinal sections of the modified trace design may be unchanged from the corresponding sections of an original trace design, provided that the impedance and other characteristics of the overall circuit remain within specification. In a more general sense, some latitudinal sections of a modified feature design may be unchanged from the corresponding sections of an original feature design, provided that the functional characteristics of the feature remain as desired.

While the sections 650, 660 and 670 of the modified trace design 600 benefit from widening because they are subject to over-etching due to their being oriented in a purely latitudinal direction, sections that are oriented with both a longitudinal and latitudinal component (i.e. at a non-zero angle other than 90 degrees relative to the machine direction) also are subject to some over-etching relative to a longitudinally oriented section and so also benefit the widening. This is true of linear sections as well as arc sections whose tangents are at a non-zero angle other than 90 degrees relative to the machine direction. For example, a circular feature design may be modified by progressively enlarging and then reducing the width as the tangent to the circular feature changes from parallel to perpendicular and back to parallel relative to the machine direction, resulting in a modified feature design having oval edges.

Figure 9:
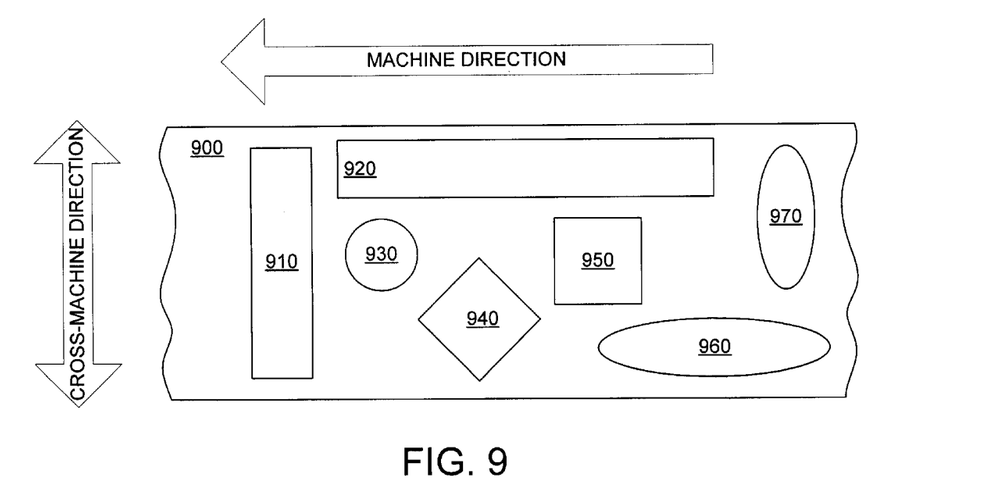
FIG. 9 is a schematic representation of the movement of another web containing product units through a machine that performs a continuous etch.

FIG. 9 is a schematic diagram of a section of a web 900 that contains a variety of product units 910, 920, 930, 940, 950, 960 and 970 of various shapes, sizes and configurations. FIG. 9 suggests the variety of different types of product units to which the techniques described herein may be applied. The web 900 is moved through the bath of a continuous etch process along its length, and indicated by the arrow marked "MACHINE DIRECTION." The other direction is the "CROSS-MACHINE DIRECTION." The rectangular product unit 910 is suggestive of a product unit that may have long sections of one or more features lying in a cross-machine direction and which are widened in accordance with the techniques described herein. The rectangular product unit 920 is suggestive of a product unit that may have short sections of one or more features lying in a cross-machine direction and which are widened in accordance with the techniques described herein. The circular product unit 930 is suggestive of a product unit that may have one or more circular features, parts of which are progressively widened in accordance with the techniques described herein. The square product unit 940 is suggestive of a product unit that may have two opposing sections lying in a cross-machine direction and which are widened in accordance with the techniques described herein. The square product unit 950 is suggestive of a product unit that may have four opposing sections lying in part in a cross-machine direction and which are all widened in accordance with the techniques described herein. The oval product unit 960 is suggestive of a product unit that may have short arcs lying in a cross-machine direction and which are widened in accordance with the techniques described herein. The oval product unit 970 is suggestive of a product unit that may have long arcs lying in a cross-machine direction and which are widened in accordance with the techniques described herein.

While the techniques described herein are especially useful for forming product units from a web whose metal-containing layer is aluminum or copper foil, the techniques described herein may also be used to form product units from a web whose metal-containing layer is made in other ways such as, for example, by vapor deposition of metal. The metal itself may be a any metal or any alloy, or may contain added impurities to achieve certain desired electrical properties such as a particular resistivity or certain desired mechanical or chemical properties, or may be coated by an oxide of the metal formed by interaction of the metal with oxygen. Moreover, the metal-containing layer may be a composite structure made of multiple layers, which may include such material as metal foil or vapor deposited metal or both, and may even include non-metallic materials. The metal-containing layer may also be a non-metallic material such as polysilicon into which metal impurities have been introduced by doping or other suitable process to achieve a desired degree of electrical conductivity.

The scope of the invention is set forth in the following claims. The description of the various embodiments set forth herein is illustrative of the invention and is not intended to limit the scope thereof. Variations and modifications of the embodiments disclosed herein will become apparent to those of ordinary skill in the art upon reading this patent document, and alternatives to and equivalents of the various elements of the embodiments will be known to those of ordinary skill in the art. These and other variations and modifications of the embodiments disclosed herein may be made without departing from the scope and spirit of the invention as set forth in the following claims.

What is claimed is:

1. A metal-containing web for use in a continuous etch process to produce a product unit having at least one feature corresponding to an original feature design, comprising:
   a metal-containing layer; and
   an etch-resistant layer disposed over the metal-containing layer, the etch-resistant layer having a pattern defining the feature and the pattern having portions transverse to a direction of elongation of the web being enlarged relative to corresponding portions of the original feature design.

2. The web of claim 1 further comprising a substrate layer, the metal-containing layer being disposed over the substrate layer.

3. The web of claim 2 wherein:
   the original feature design is a trace design;
   at least some of the transverse portions of the pattern are at least in part oriented latitudinally relative to the direction of elongation of the web; and
   the latitudinally oriented portions of the pattern have respective lengths commensurate with corresponding portions of the trace design, and respective widths wider than corresponding portions of the trace design.

4. The web of claim 3 wherein the length is a linear length.

5. The web of claim 3 wherein the length is an arc length.

6. The web of claim 1 wherein the metal-containing layer comprises aluminum foil.

7. The web of claim 1 wherein the metal-containing layer comprises copper foil.

8. A metal-containing web for use in a continuous etch process to produce a planar speaker product unit having at least one trace corresponding to an original trace design, comprising:

a substrate layer;

a metal-containing layer disposed over the substrate layer; and an etch-resistant layer disposed over the metal-containing layer, the etch-resistant layer, having a pattern defining the trace, the pattern having portions transverse to a direction of elongation of the web being widened relative to corresponding portions of the original feature design, and the pattern having portions parallel to a direction of elongation of the web being unmodified relative to corresponding portions of the original feature design.

9. The web of claim 8 wherein:

the transverse portions of the pattern are linear sections oriented latitudinally relative to the direction of elongation of the web, the latitudinally oriented portions of the pattern have respective lengths commensurate with corresponding portions of the trace design, and respective widths wider than corresponding portions of the trace design; and the substantially parallel portions of the pattern are linear sections oriented longitudinally relative to the direction of elongation of the web, the longitudinally oriented portions of the pattern have respective lengths and widths commensurate with corresponding portions of the trace design.

10. The web of claim 8 wherein:

the transverse portions of the pattern are arc sections having respective arc lengths commensurate with corresponding portions of the trace design, and respective widths wider than corresponding portions of the trace design; and the substantially parallel portions of the pattern are linear sections oriented longitudinally relative to the direction of elongation of the web, the longitudinally oriented portions of the pattern have respective lengths and widths commensurate with corresponding portions of the trace design.

* * * * *

UNITED STATES PATENT AND TRADEMARK OFFICE
CERTIFICATE OF CORRECTION

PATENT NO. : 6,492,009 B1
DATED : December 10, 2002
INVENTOR(S) : Laurence M.C. Lai It is certified that error appears in the above-identified patent and that said Letters Patent is hereby corrected as shown below:

<u>Column 9,</u>
Line 56, delete "940" and insert -- 950 --; and
Line 60, delete "950" and insert -- 940 --.

<u>Column 11,</u>
Lines 8 and 9, delete "feature design" and insert -- trace design --; and
Lines 11 and 12, delete "feature design" and insert -- trace design --.

Signed and Sealed this

Second Day of December, 2003

JAMES E. ROGAN
*Director of the United States Patent and Trademark Office*